United States Patent [19]

Hopwood et al.

[11] 4,123,719
[45] Oct. 31, 1978

[54] CHIRP PHASE DISTORTION DETECTOR IN A WIDEBAND LINEARIZATION FEEDBACK CONTROL LOOP

[75] Inventors: Francis W. Hopwood, Severna Park; Lester K. Staley, Baltimore, both of Md.

[73] Assignee: Westinghouse Electric Corp., Pittsburgh, Pa.

[21] Appl. No.: 789,906

[22] Filed: Apr. 22, 1977

[51] Int. Cl.² .......................................... H03K 13/32
[52] U.S. Cl. .................................. 328/155; 329/104; 343/17.2 PC
[58] Field of Search ................ 329/104, 106; 328/155; 343/17.2 PC

[56] References Cited

U.S. PATENT DOCUMENTS

| 3,898,660 | 8/1975 | Munster | 343/17.2 PC |
| 3,906,376 | 9/1975 | Bass | 329/104 |
| 3,919,653 | 11/1975 | Le Mouel | 329/104 |
| 4,047,173 | 9/1977 | Miller | 343/17.2 PC |

Primary Examiner—John S. Heyman
Attorney, Agent, or Firm—H. W. Patterson

[57] ABSTRACT

A phase distortion detector is used in a wideband feedback control loop to detect phase distortion on a wideband pulsed linearly frequency modulated waveform (chirped) without the use of excessively long delay lines. The detector mixes two reference signals, each of a predetermined frequency, one frequency higher than the other. A phase lock loop ensures that the two signals are phase coherent. Each signal is then mixed with the chirped waveform, delayed for different time intervals, and mixed again to produce an error signal proportional to the phase distortion on the chirp pulse which distortion is also an indication of the frequency non-linearity of the chirp pulse. The error signal is then used to correct such non-linearity.

5 Claims, 6 Drawing Figures

CHIRP PHASE DISTORTION DETECTOR IN A WIDEBAND LINEARIZATION FEEDBACK CONTROL LOOP

BACKGROUND OF THE INVENTION

1. Field of the Invention

This invention pertains to the field of pulsed phase modulated radar systems, and more particularly to an apparatus for detecting and correcting the undesirable frequency non-linearities which arise during the generation and transmission of a pulsed linearly frequency modulated signal.

2. Description of the Prior Art

Pulse compression radar systems are commonly referred to as chirp radar systems. This type of system provides a solution for the conflicting requirements of simultaneous long-range and high-resolution performance in radar systems. These requirements are conflicting because in order to obtain high resolution of a radar target, the transmitted pulse must be very narrow, i.e., wide bandwidth pulses. That is, the higher the desired target resolution, the narrower the transmitted pulse must be. However, long-range target detection requires that the transmitted pulse have a larger power content. Power content is directly proportional to the area under the transmitted pulse. In order for a transmitted pulse to have both high target resolution and long range detection capabilities it will have to be both narrow and envelop a large area. This large area can come only from increasing the height of the pulse, if high target resolution is to be maintained. The peak power required to transmit such a high, narrow pulse is so large as to be impractical.

The chirp technique eliminates the need for a high, narrow pulse and the associated high peak power transmitter. The technique employs a long high-duty factor transmitted pulse, which high duty-factor provides a large power content because of the large area it envelops. The large power content provides for long-range target detection. In addition, the pulse is linearly frequency modulated (chirped) which allows it to cover a frequency interval many times the inherent bandwidth of the envelope. This increase in bandwidth provides for additional target resolution. The chirp technique, then, provides a radar system with both long-range target detection and high target resolution without the need for high peak power transmitters.

In the use of chirp radar systems, however, it is very important that the frequency modulation be extremely linear. However, during the generation and transmission of the chirp pulse, undesirable incidental phase and amplitude distortion is often introduced onto the radar signals in the form of phase and amplitude modulation. This phase and amplitude distortion tends to degrade the chirp radar performance.

Various prior attempts have been made to improve linearity. But, these schemes exhibit high frequency non-linearities. For example, the conventional delay line feedback technique is widely used for generating chirp pulses and yields excellent results at low chirp bandwidths. This technique involves passing the chirp waveform through a delay line whose group delay is constant over the chirp bandwidth and is short compared to the chirp duration. The delayed waveform is mixed with the undelayed waveform, generating a pulse of an intermediate frequency. However, if the delay line is not sufficient length, the intermediate frequency is too low to accept the information rates necessary for applications requiring a wideband control loop, which wideband control loop is necessary for high target resolution in a radar system. Constructing a delay line of sufficient length to provide a high intermediate frequency invariably results in phase non-linearities in the delayed signal. What is desired, then, is a means of linearizing a chirp radar pulse to provide a high power, high resolution radar system using a delay line feedback technique without introducing the phase distortion involved in using a very long delay line.

SUMMARY OF THE INVENTION

The present invention is a phase modulation detector which detects undesirable phase modulation on a wideband pulsed linearly frequency modulated waveform, commonly known as a chirped waveform or a chirped pulse. The detector produces an output error signal proportional to the undesirable phase distortion present in the chirp pulse. This distortion is a measure of the frequency non-linearity of the chirp pulse. In response to a clock, the detector generates two reference signals whose frequencies are offset from each other by a predetermined fixed frequency. Each reference signal is mixed with the chirped waveform to produce two intermediate output signals, one of which is delayed for a period of time and mixed with the undelayed output to produce a measure of non-linearity of the chirped pulse.

A feature of this invention is that the detector eliminates the necessity for long delay lines where wide loop bandwidths are needed in order to achieve high resolution in a long range radar system.

DETAILED DESCRIPTION

Figure 1:
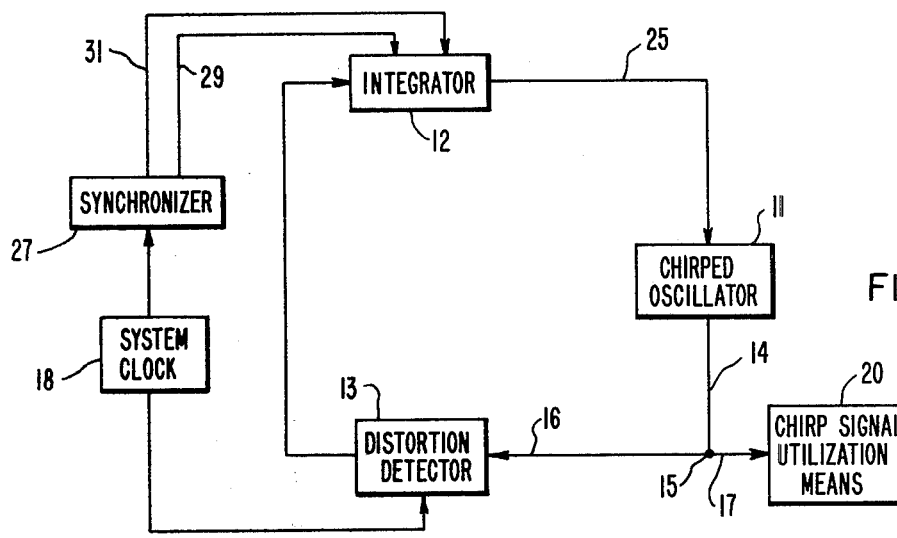
FIG. 1 is a block diagram of a chirped pulse generation system with the benefit of the invention.
Figure 2:
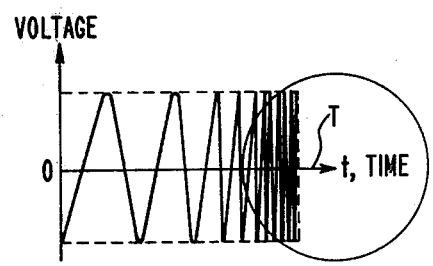
FIG. 2 illustrates an amplitude-versus-time plot characteristic of a chirp pulse.
Figure 3:
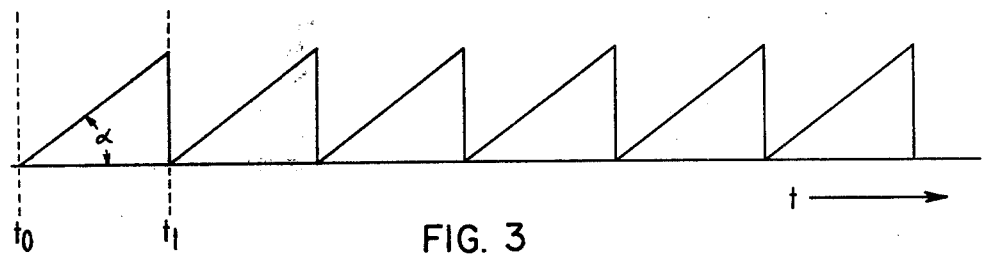
FIG. 3 illustrates an output waveform of a typical integrator circuit.
Figure 4:
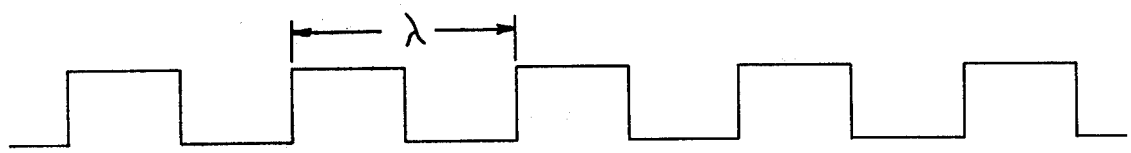
FIG. 4 illustrates an output waveform of a typical oscillator used as a system clock.
Figure 6:
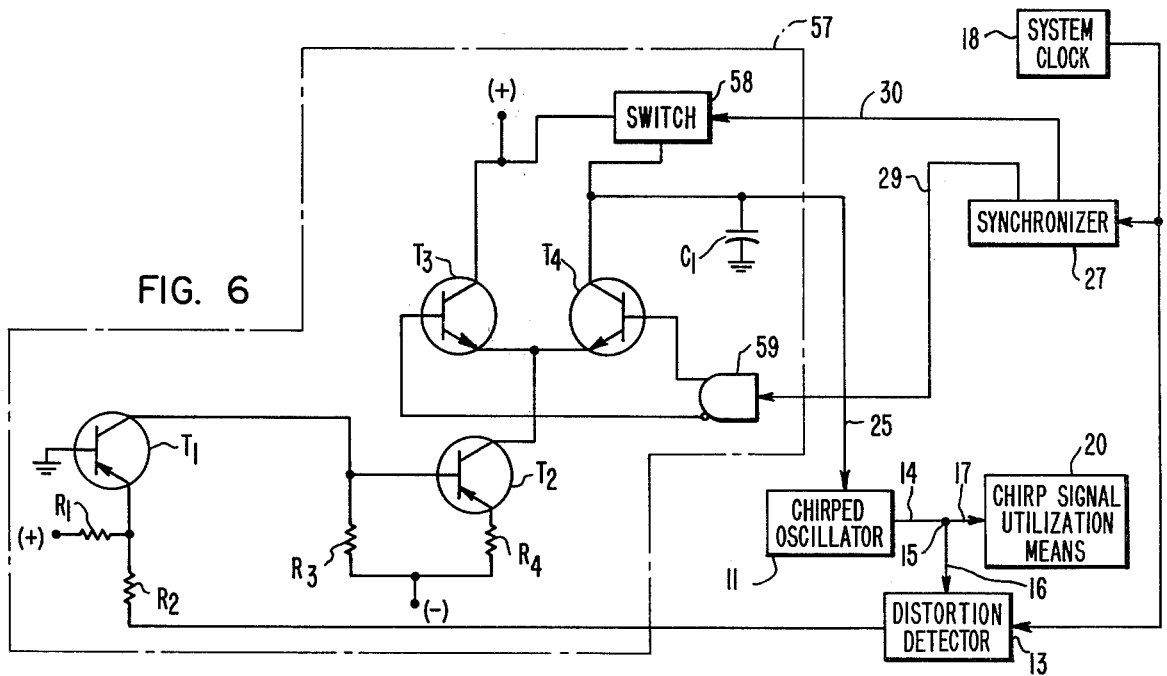
FIG. 6 shows a practical embodiment of an integrator as used in conjunction with the detector of the present invention.

FIG. 1 is a general block diagram of a wideband linearization control loop for chirp generators with the benefit of the present invention. An oscillator 11 generates a linear frequency modulated signal whose frequency sweep is controlled by an integrator 12, sometimes called a ramp generator. The integrator 12 can be any conventional circuit capable of integrating a frequency modulation envelope output by a phase distortion detector 13. An example of such a conventional integrator is shown in FIG. 6 within the dashed lines at 57. A chirped signal from the oscillator 11, similar to the waveform shown in FIG. 2, passes along a lead portion 14, through a node 15, along a lead portion 16 and into the phase distortion detector 13. The same signal passes along a lead portion 17 into a chirp utilization means 20. An error signal generated by the phase distortion detector 13 passes out of the detector 13 into the integrator 12. The modified integrator signal passes along a lead 25 and into the oscillator 11 to correct any non-linearities detected by the detector 13. The output signal of the integrator 12 is similar to the sawtooth waveform shown in FIG. 3 where a slope $\alpha$ is typically $10^{-2}$ Hz/sec. A digital synchronizer 27, which provides timing signals for the entire radar system, provides a timing signal on a line 29 which determines the slope of the waveform generated by the integrator in FIG. 3. A signal on a line 31 is a timing signal which resets the integrator 12 at an appropriate time shown at $t_1$ in FIG. 3. A typical time period from $t_0$ to $t_1$ is 100 $\mu$s to 1ms. A typical synchronizer would include, among other elements, various divider circuits and multiplier circuits which would produce, in response to pulses generated by a system clock 18, one or more sets of timing waveforms. The synchronizer 27 can be any circuit or system capable of producing sets of synchronous or asynchronous timing waveforms at its one or several outputs in response to the system clock 18. The system clock 18 can be any oscillator capable of generating pulses of the form shown in FIG. 4 where $\lambda$ is typically 3 to 6 meters.

Figure 5:
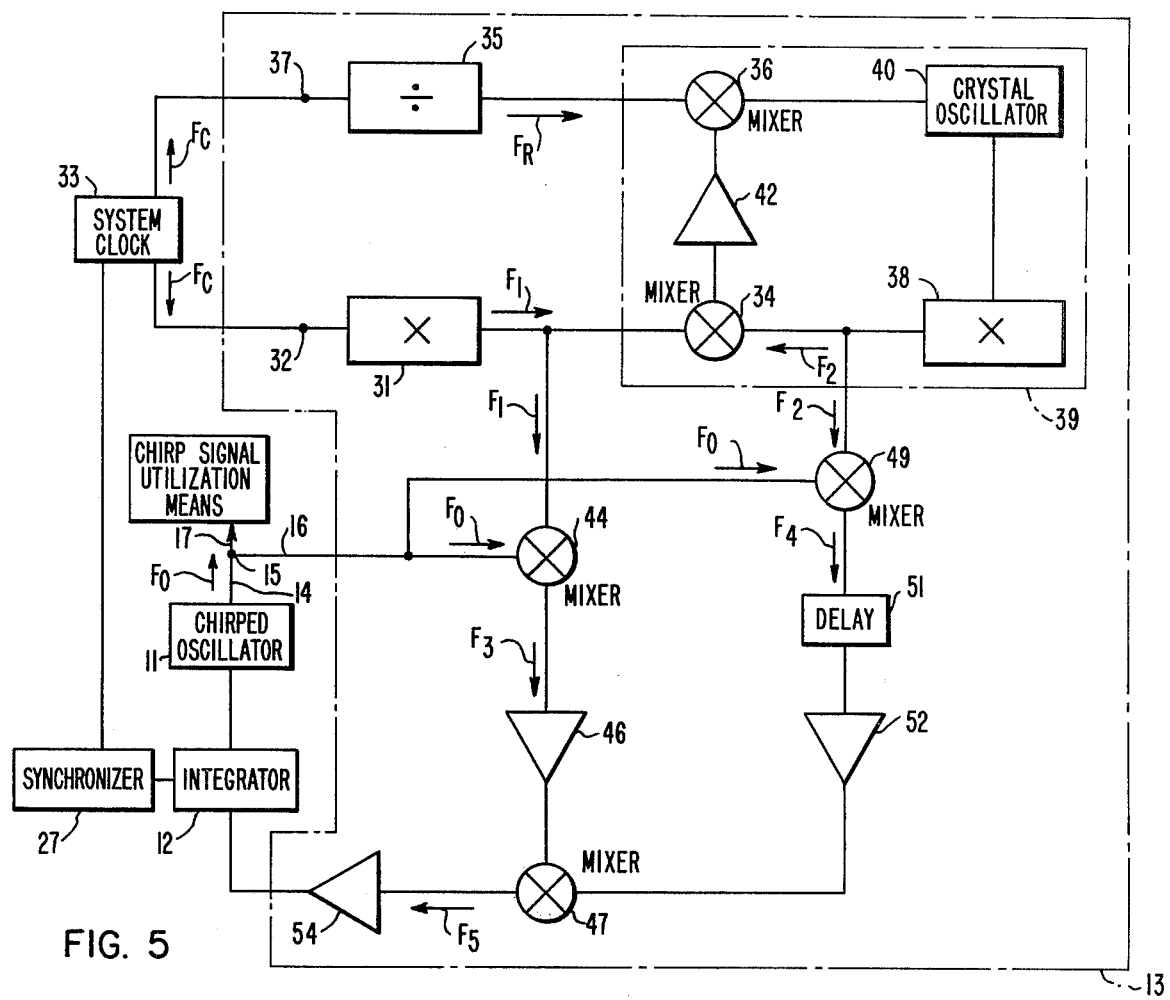
FIG. 5 shows a more detailed view of a phase distortion detector for indicating frequency non-linearity in a chirped pulse as it is used in a feedback control loop according to the present invention.

Referring to FIG. 5, the detector 13 includes a conventional frequency multiplier 31 having its input connected to a terminal 32 and its output connected to a phase detector 34. The multiplier 31 generates a signal $F_1$ of frequency $f_1$ and phase $\phi_1$, in response to a fixed frequency microwave signal $F_c$ generated by the system clock 18 and applied to the terminal 32. The system clock 18 may be the clock for the digitial synchronizer 27. A conventional frequency divider 35 having its input connected to a terminal 37 and its output connected to a phase detector 36 generates a signal $F_R$ of frequency $f_R$ and phase $\phi_R$ in response to the signal $F_C$ generated by the clock 18 and applied to the terminal 37. The frequency $f_R$ of the signal $F_R$ can be any frequency predetermined by radar application.

A phase-locked loop within the dashed lines at 39 is formed by a conventional frequency multiplier 38 having its output connected to the phase detector 34 and its input connected to the output of a voltage controlled crystal oscillator 40. The input of the oscillator 40 is connected to the output of the phase detector 36. The oscillator 40 can be any conventional crystal oscillator with varactor diodes used in conjunction with the crystal in order to control the oscillator frequency. Such an oscillator is well known in the electrical arts. The loop 39 is completed by coupling the phase detectors 36 and 37 with an amplifier 42. The oscillator 40 and the multiplier 38 generate a microwave signal $F_2$ whose frequency is the difference between the frequencies of the signals $F_1$ to $F_R$ and whose phase is equal to the phase of the signal $f_1$. The frequency of the signal $F_2$ is $f_2$, where $f_2$ is computed:

$$f_2 = f_1 - f_R.$$

The phase-lock loop 39 forces the signals $F_1$ and $F_2$ to be phase coherent by automatically adjusting the frequency of the oscillator 40 in response to an output signal from the phase detector 36.

The chirped oscillator 11 generates a signal $F_0$ whose frequency $f_0(t)$ is a function of time. The signal $F_0$ is mixed with the signal $F_1$ by the phase detector 44 to produce a signal $F_3$ whose frequency is the difference between the frequencies of the signals $F_1$ and $F_0$. The frequency of the signal $F_3$ is $f_3$, where $f_3$ is computed:

$$f_3 = f_1 - f_0(t).$$

The signal $F_3$ is then amplified by an amplifier 46 and applied to a phase detector 47. The chirped signal $F_0$ from the oscillator 11 is also mixed with the signal $F_2$ by a phase detector 49 to produce a signal $F_4$ whose frequency is the difference between the frequencies of the signals $F_0$ and $F_2$. The frequency of the signal $F_4$ is $f_4$ where $f_4$ is computed:

$$f_4 = f_2 - f_0(t) = f_1 = f_R - f_0(t).$$

A delay line 51 delays the signal $F_4$ for a time T, after which time, the signal $F_4$ is amplified by an amplifier 52 and applied to the phase detector 47. The delay time T is a function of $F_R$ $$T = F_R (\tau/F_0) \text{ (seconds)}$$

where $\tau$ is the duration of the chirped waveform in seconds. Also, for optimum performance, the gain characteristics of the amplifier 46 and 52 should be substantially similar, as should their phase versus frequency characteristics. As an operative example of how the detector 13 functions, consider a typical application where:

$\Delta F$ = chirped waveform bandwidth = 2GHz.
$\tau$ = chirped waveform duration (sec.) = $10^{-3}$ sec.
$T$ = delay line length (sec.) = $32 \times 10^{-9}$ sec.
$F_{vco}$ = chirp waveform frequency range = 6 to 8GHz. Then the parameters of the divider 35 must be chosen such that the frequency $f_R$ of the signal $F_R$ is $$f_R = \Delta F (T/\tau) H_z = 64 \text{ KHz}.$$

Referring to FIG. 7, the loop bandwidth $f_B$ can be computed as:

$$f_B = (AT/RC)(dV/d\phi)(dF/dV)$$

where,
$A$ = the video gain of the amplifier 54
$R, C$ = values of the resistors $R_1, R_2, R_3, R_4$ and the capacitor $C_1$
$dV/d\phi$ = the sensitivity of the mixer 47
$df/dV$ = the tuning slope of the oscillator 11.
If we let
$A$ = 43.5 dB
$R$ = 510 $\Omega$
$C$ = 0.47 $\mu f$
$DV/d\phi$ = 2 GHz/20 volts
$df/dV$ = 0.3 volts/radian
Then
$$f_B = 1.0 \text{ MHz}$$
which is higher than the usual loop bandwidths of 20 KHz to 30 KHz. Since the chirped waveform duration $\tau$ is $10^{-3}$ sec. in the operative example, the loop has 60 dB gain at the first fourier component which represents a 1000 to 1 improvement in the chirped waveform linearity, and 40 dB gain at the tenth fourier component which represents a 100 to 1 improvement in the chirped waveform linearity. In FIG. 6, the resistors $R_1$ through $R_4$ are conventional as are the transistor $T_1$ through $T_4$ and the capacitor $C_1$. A gate 59 provides inverting and non-inverting outputs of the input signal on the line 29 to the transistors $T_3$ and $T_4$, respectively. A signal on the line 30 controls the opening and closing of a switch 58 to effect a waveform on the lead 25 similar to that shown in FIG. 3. The switch 58 can be a conventional transistor switch or any other switch capable of opening and closing in response to the signal on the line 30 and allowing the capacitor $C_1$ to discharge when the switch 58 is in a closed position.

The FM noise requirement determined by a particular radar application imposes a lower bound on the delay time T of the delay line 51. The RMS frequency noise within the loop bandwidth due to the video sensitivity of the phase detector 47 is N where $$\sqrt{N^2} = \frac{\sqrt{e^2}}{2\,T(dV/d\phi)}$$

where $e^2$ is the noise in the amplifier 54. This corresponds to phase sidebands of −135 dB/Hz at 100 KHz, falling at −20 dB/decade. This would be substantially smaller than the inherent chirped oscillator noise and is about 52 dB smaller than would be achieved using a linear discriminator technique, for example, with a discriminator sensitivity of 10 GHz/volt. The highest tolerable noise, N, would depend on the particular radar application. An excess phase shift $\phi_c$ at the loop crossover frequency imposes an upper bound on the delay time T of the delay line 51. As the phase shift $\phi_c$ increases, the loop instability increase. The delay line 51 causes the excess phase $\phi_c$ computed as $$\phi_c = 2\,F_2\left(\frac{T}{2}\right)$$

In the operative example $\phi_c = 5.68°$ or 0.0992 radians. This low excess phase shift $\phi_c$ causes negligible loop instability. The output of the phase detector 47 is a signal $F_5$ whose magnitude is indicative of the phase difference between the amplified version of the signal $F_3$ and the delayed and amplified version of the signal $F_4$, which phase difference is also an indication of the frequency non-linearity of the chirped signal $F_0$. The signal $F_5$ is amplified by an amplifier 54 and applied to the integrator 12 to correct such non-linearity.

It should be noted that the amplifiers 46 and 52 may be eliminated from the invention without any degradation in performance if the outputs of the phase detectors 44 and 49 are of such magnitude as to satisfactorily operate the phase detector 47.

For optimal performance, the phase/frequency ratio of the amplifiers 46 and 52 should be similar at all frequencies. It is well known in the electrical art that such phase matching can be achieved by adjusting the amplifier network. Also, for optimal performance, the gain parameters of the amplifiers 46 and 52 as measured in decibels should be similar.

A major feature of the present invention is that the loop bandwidth and therefore the loop gain is improved which improvement is needed to produce improved chirped signal linearity.

What we claim is:

1. In a system having a clock and utilizing means to generate a pulsed linearly frequency modulated waveform, a phase distortion detector comprising:
   a signal generating means responsive to said clock for producing a first signal having a first predetermined frequency along a first signal path and a second signal having a second predetermined frequency less than said first predetermined frequency along a second signal path;
   a phase comparison means connected to and responsive to said first and second signals and to said frequency modulated waveform for producing a third signal proportional to the non-linearity of said frequency modulated waveform; p1 means for applying said third signal to said means to generate a pulsed linearly frequency modulated waveform.

2. The detector of claim 1 wherein said signal generating means includes: a phase locked loop, including;
   first and second phase detectors coupled to each other, oscillator means for generating a signal of a third frequency responsive to the output of said second phase detector, a first frequency multiplication means coupled between said oscillator means and said first phase detector and operative to produce said second signal in response to the output of said oscillator means;
   a second frequency multiplication means coupled between said first phase detector and said clock and operative to produce said first signal in response to the output of said clock, and a frequency dividing means coupled between said second phase detector and said clock.

3. The detector of claim 1 wherein said phase comparison means includes
   a third phase detector responsive to said first signal and said frequency modulated waveform and operative to develop a first error signal, a fourth phase detector responsive to said second signal and said frequency modulated waveform and operative to develop a second error signal;
   delaying means for delaying said second error signal to produce a delayed second error signal, a fifth phase detector responsive to said first error signal and said delayed second error signal to develop a third error signal commensurate with any difference in phase between said first error signal and said delayed error signal.

4. The detector of claim 2 wherein said phase locked loop is further comprised of:
   amplification means coupled between said first and second phase detectors.

5. The detector of claim 3 wherein said phase comparison means further comprises:
   a first amplification means coupled between said third and fifth phase detector, a second amplification means coupled between said delaying means and said fifth phase detector, and a third amplification means coupled to the output of said fifth phase detector.

* * * * *